United States Patent
Poulton et al.

(10) Patent No.: US 9,627,021 B2
(45) Date of Patent: Apr. 18, 2017

(54) 8-TRANSISTOR DUAL-PORTED STATIC RANDOM ACCESS MEMORY

(71) Applicant: NVIDIA Corporation, Santa Clara, CA (US)

(72) Inventors: John W. Poulton, Chapel Hill, NC (US); Brian Zimmer, Berkeley, CA (US)

(73) Assignee: NVIDIA Corporation, Santa Clara, CA (US)

( * ) Notice: Subject to any disclaimer, the term of this patent is extended or adjusted under 35 U.S.C. 154(b) by 412 days.

(21) Appl. No.: 13/648,053

(22) Filed: Oct. 9, 2012

(65) Prior Publication Data

US 2014/0098596 A1    Apr. 10, 2014

(51) Int. Cl.
*G11C 11/00* (2006.01)
*G11C 8/16* (2006.01)
*G11C 11/419* (2006.01)

(52) U.S. Cl.
CPC ............. *G11C 8/16* (2013.01); *G11C 11/419* (2013.01)

(58) Field of Classification Search
CPC ................................. G11C 8/16; G11C 11/419
USPC .............. 365/154, 226, 230.05, 230.03, 156
See application file for complete search history.

(56) References Cited

U.S. PATENT DOCUMENTS

| | | | |
|---|---|---|---|
| 8,760,958 B2* | 6/2014 | Iyer | G11C 11/412 365/154 |
| 2002/0006072 A1* | 1/2002 | Kunikiyo | 365/230.05 |
| 2009/0310398 A1* | 12/2009 | Nguyen | 365/156 |
| 2010/0002531 A1* | 1/2010 | Lee et al. | 365/226 |

OTHER PUBLICATIONS

Wann, et al., "SRAM Cell Design for Stability Methodology", IEEE, 2005 pp. 21-22.
Lin, et al., "A 32nm SRAM Design for Low Power and High Stability", IEEE, 2008 pp. 422-425.

* cited by examiner

*Primary Examiner* — Richard Elms
*Assistant Examiner* — Mohammed A Bashar
(74) *Attorney, Agent, or Firm* — Artegis Law Group, LLP (57) ABSTRACT

An 8-transistor SRAM (static random access memory) storage cell provides differential read bit lines that are precharged to a low voltage level for read operations. The 8-transistor storage cell provides separate ports for read and write operations, including differential read bit lines. Prior to each read operation, the differential read bit lines are precharged to the low voltage level. During read operations, one of the two differential read bit lines is pulled high towards a high voltage level while the complementary bit line remains at the low voltage level resulting from the precharge. The difference in voltage between the differential read bit lines is sensed to determine the value stored in each 8-transistor SRAM storage cell and complete the read operation.

15 Claims, 6 Drawing Sheets

8-TRANSISTOR DUAL-PORTED STATIC RANDOM ACCESS MEMORY

BACKGROUND OF THE INVENTION

Field of the Invention

The present invention generally relates to digital memory circuits and more specifically to an 8-transistor dual-ported static random access memory (SRAM).

Description of the Related Art

As integrated circuit process technology advances, transistors having smaller dimensions can be fabricated and the density of semiconductor memory devices increases. However, as transistor sizes shrink, the reliability of conventional storage cells is reduced due to variations in the process technology and low operating voltages of the memory devices.

Figure 1A:
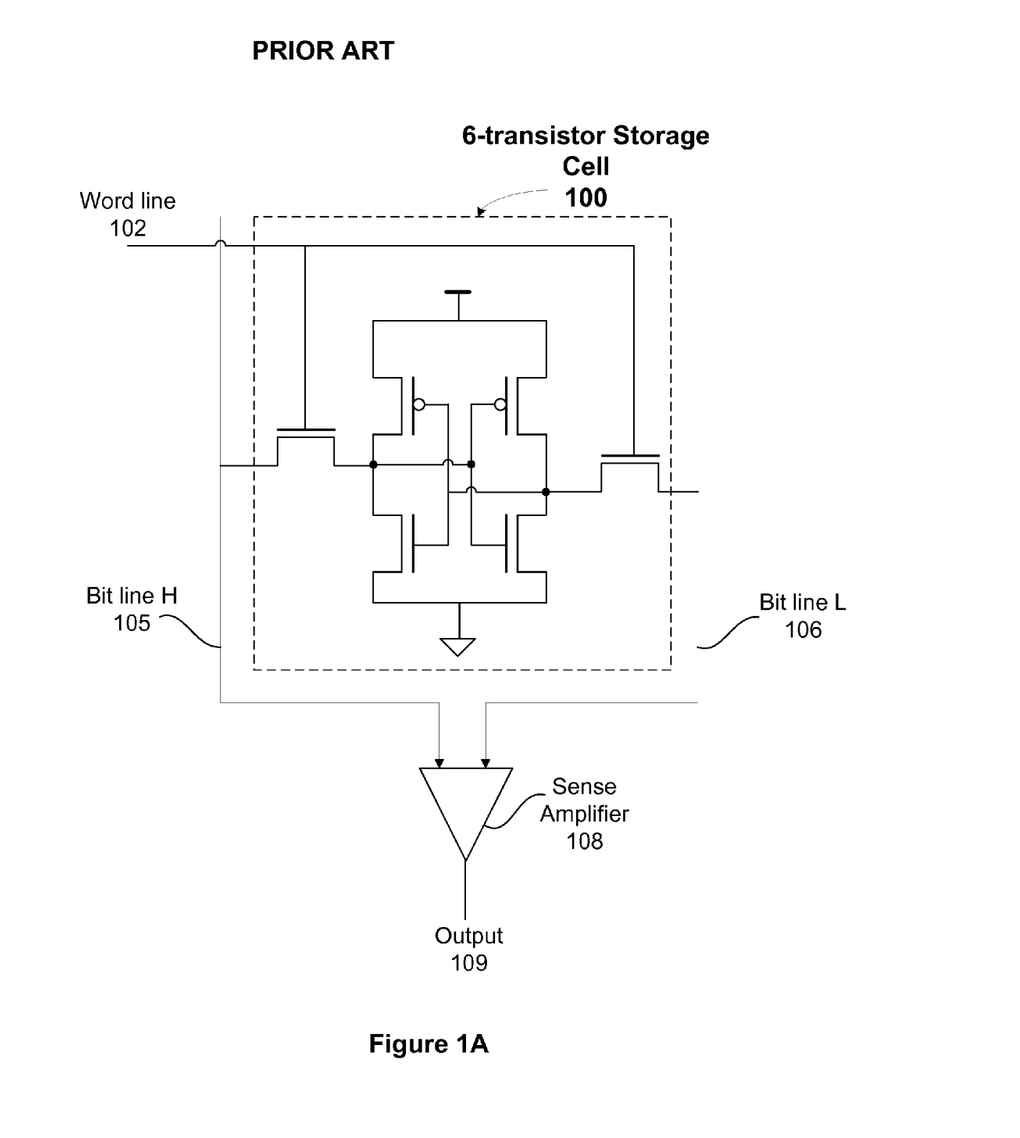
FIG. 1A illustrates a conventional 6-transistor storage cell configured in a memory array, according to the prior art.

For example, FIG. 1A illustrates a 6-transistor storage cell 100 configured in a memory array, according to the prior art. The 6-transistor storage cell 100 is a conventional static random access memory (SRAM) cell that includes four NMOS (n-type metal oxide semiconductor) transistors and two PMOS (p-type metal oxide semiconductor) transistors. A word line 102, coupled to the gates of two pass transistors, may be enabled to read from or write to a storage circuit formed by cross-coupled inverters. The word line 102 is coupled to many 6-transistor storage cells 100 in a row, but only one row is accessed during a read or write operation. When the word line 102 is asserted (driven to a high voltage or TRUE) to perform a read operation, the bit stored in the storage circuit is transferred to bit line H 105 and the complement is transferred to bit line L 106. A sense amplifier 108 amplifies the difference in voltage levels between bit line H 105 and bit line L 106 and the amplified difference, output 109 is sampled to read the bit stored in the 6-transistor storage cell 100.

As fabricated transistor sizes shrink and operating voltages are reduced, read operations may be unstable when the transistor threshold voltage is too large compared with the operating voltage, leaving little margin for switching. A read disturb fault occurs when the word line 102 is asserted to read a first 6-transistor storage cell 100. As a consequence, the first 6-transistor storage cell 100 or any other 6-transistor storage cell in the row may be inadvertently written when the first 6-transistor storage cell 100 is read. Therefore, the value stored in the second 6-transistor storage cell 100 may be changed (disturbed) during the read of the first 6-transistor storage cell 100.

The read disturb fault results from a transistor mismatch caused when the size of the access transistors coupled to bit line H 105 and bit line L 106 is increased to ensure that the 6-transistor storage cell 100 can be reliably written. Specifically, to successfully write the 6-transistor storage cell 100, the access transistors must be able to overcome the pullup current generated in the PMOS pull-ups and the pulldown current in the pulldowns. On the other hand, for the 6-transistor storage cell 100 to be readable, the access transistors should be small relative to the pulldown transistors. The smaller access transistor sizing maximizes the positive voltage margin needed to guarantee that the value stored in the cell is not flipped during a read operation. Clearly, the two operational modes (read and write) have conflicting goals that present a greater challenge as the process technology shrinks and operating voltages are reduced.

Figure 1B:
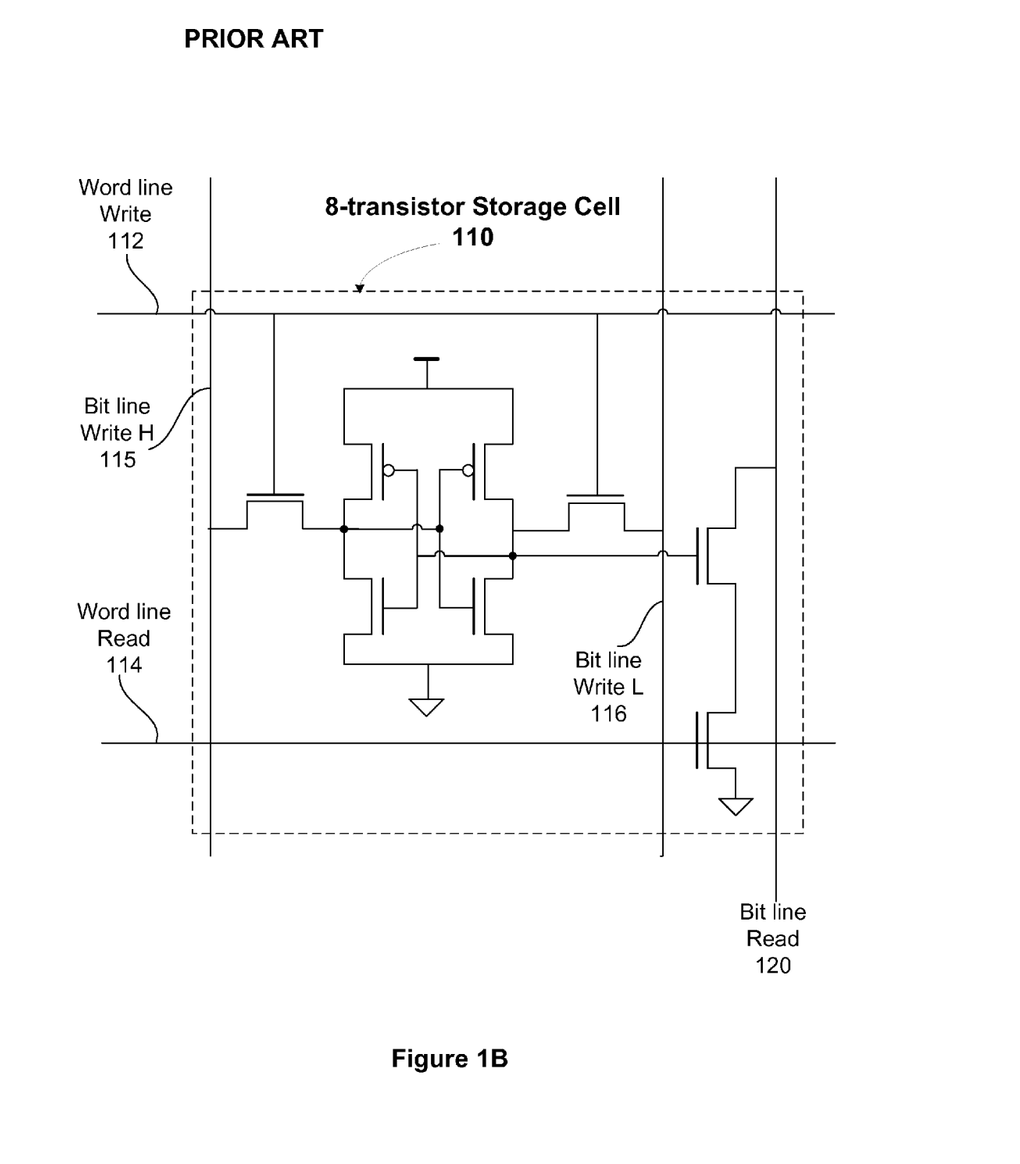
FIG. 1B illustrates a conventional 8-transistor storage cell configured in a memory array, according to the prior art.

An alternative to the conventional 6-transistor storage cell is an 8-transistor storage cell. FIG. 1B illustrates an 8-transistor storage cell configured in a memory array, according to the prior art. The 8-transistor storage cell 110 is also conventional SRAM cell. The 8-transistor storage cell 110 includes six NMOS transistors and two PMOS transistors and is robust compared with the 6-transistor storage cell 100 because two additional NMOS transistors are used in the 8-transistor storage cell 110 to prevent read disturb faults.

Separate word lines are provided for reading and writing to avoid read disturb faults. More specifically, a word line write 112 is coupled to the gates of two pass transistors. When a write operation is performed the word line write 112 is asserted and the value to be written is driven on bit line write H 115 and the complement of the value is driven on bit line write L 116. When a read operation is performed to read from a first 8-transistor storage cell 110, the bit line read 120 is precharged to a high voltage level, the word line read 114 is asserted, and the value stored in the 8-transistor storage cell 110 is output to the bit line read 120. The additional transistors in the read path prevent the transfer of any signal to the storage circuits of the 8-transistor storage cells 110. Therefore, read disturb faults are prevented.

Although the 8-transistor storage cell 110 is more robust compared with the 6-transistor storage cell, both cells do require precharging of the bit lines for read operations. Furthermore, the bit lines are precharged to a relatively high voltage (typically VDD, the high power supply voltage) so that a difference between a "1" and "0" can be detected. In particular, the bit line read 120 is precharged to a high voltage level and driven to a low voltage level when a "0" is read. The precharge and potential discharge for read operations increase the power consumption of the storage cell compared with an storage cell that does not require a precharge to a high voltage level for each read operation.

While the 8-transistor storage cell 110 does not suffer from read faults, the 8-transistor cell does rely on a precharge to a high voltage level for read operations. Therefore, the 8-transistor storage cell 110 consumes more power compared with the 6-transistor storage cell 100 due to the larger voltage swings that occur on the read bit line 120.

As the foregoing illustrates, what is needed in the art is a storage cell that is designed to reduce the frequency of read disturb faults and is more power efficient than conventional storage cells.

SUMMARY OF THE INVENTION

One embodiment of the present invention sets forth an 8-transistor SRAM storage cell that provides differential read bit lines that are not precharged to a high voltage level for read operations. The 8-transistor storage cell provides separate ports for read and write operations, including differential read bit lines. Prior to each read operation, the differential read bit lines are precharged to a low voltage level. During read operations, one of the two differential read bit lines is pulled high towards a high voltage level while the complementary bit line remains at the low voltage level resulting from the precharge. The difference in voltage between the differential read bit lines is sensed to determine the value stored in each 8-transistor SRAM storage cell and complete the read operation.

Various embodiments of the invention comprise a transistor storage cell circuit that includes a first read bit line that is precharged to a low power supply voltage prior to a read operation and a second read bit line that is precharged to the low power supply voltage prior to the read operation. A storage sub-circuit that is configured to store a single bit value is coupled to the first read bit line through a first access transistor and is coupled to the second read bit line through a second access transistor. A read word line is coupled to a gate of the first access transistor and a gate of the second access transistor and is configured to enable a differential representation of the single bit value to be transferred to the first read bit line and the single bit value to be transferred to the second read bit line during the read operation.

Various embodiments of the invention comprise a method of reading differential read bit lines of a transistor storage cell circuit. The method includes precharging a first read bit line and a second read bit line to a low power supply voltage prior to a read operation. A read word line is configured to enable a differential representation of a single bit value stored in a storage sub-circuit to be transferred to the first read bit line and the second read bit line and the differential representation of the single bit value is sampled at the first read bit line and the second read bit line to complete the read operation.

One advantage of the disclosed circuit is that the bit lines do not need to be precharged to a high voltage level prior to each read operation. Instead the bit lines are precharged to a low voltage level and a small voltage difference that develops between the two bit lines, e.g., at least 100 mV, is sensed to perform the read operation. Therefore, the dynamic power dissipation is reduced significantly compared with conventional 8-transistor storage cells.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

In the following description, numerous specific details are set forth to provide a more thorough understanding of the present invention. However, it will be apparent to one of skill in the art that the present invention may be practiced without one or more of these specific details. In other instances, well-known features have not been described in order to avoid obscuring the present invention.

Figure 2A:
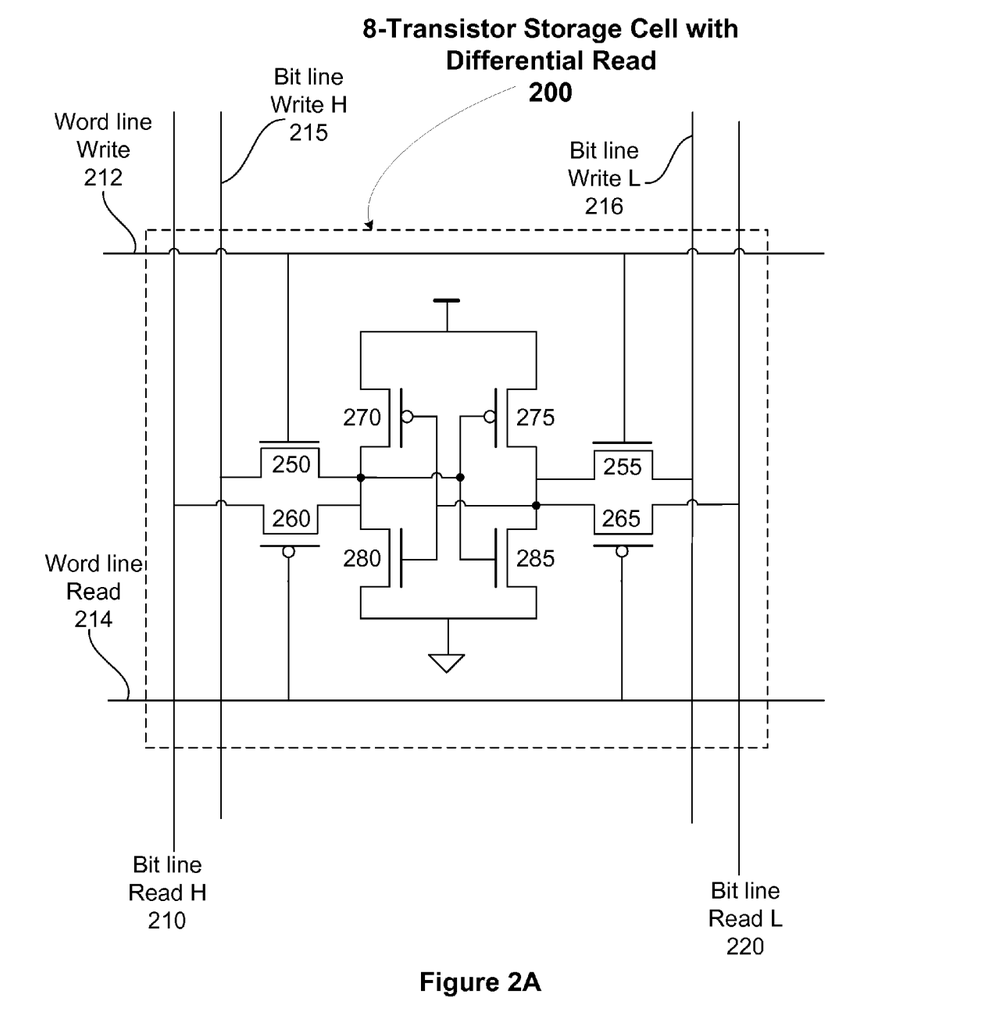
FIG. 2A illustrates a diagram of a 8-transistor storage cell with a differential read structure, according to one embodiment of the invention.

FIG. 2A illustrates a diagram of an 8-transistor storage cell circuit with differential read 200, according to one embodiment of the invention. The 8-transistor storage cell circuit with differential read 200 is structured with two independent ports, one for performing read operations and one for performing write operations. The read port uses two PMOS access transistors, e.g., 260 and 265, and provides a differential read structure. The write port uses two NMOS access transistors, e.g., 250 and 255, and provides a differential write structure. The transistors that are configured as cross-coupled inverters, 270, 275, 280, and 285, form a storage sub-circuit that stores a single bit value.

A differential representation of a single bit value is written to the storage sub-circuit via the bit line write H 215 and the bit line write L 216 when word line write 212 is asserted. The differential representation of the single bit value is read from the storage sub-circuit via the bit line read H 210 and the bit line read L 220 when word line read 214 is driven low (negated).

Unlike the conventional 8-transistor storage cell 110, the read port of the 8-transistor storage cell circuit with differential read 200 is differential, allowing a read operation having a smaller voltage swing compared with the conventional 8-transistor storage cell 110. Therefore, the 8-transistor storage cell circuit with differential read 200 consumes less power compared with the conventional 8-transistor storage cell 110.

Another advantage of the 8-transistor storage cell circuit with differential read 200 is that the strengths of the read and write ports can be adjusted independently to optimize readability and writeability without risking read faults. Therefore, unlike the 6-transistor storage cell 100, the 8-transistor storage cell circuit with differential read 100 does not suffer from read faults.

Increasing the size (specifically the width of the transistor) or drive strength of the write access transistors 250 and 255, relative to strength of the pull-down transistors 280 and 285 in the storage sub-circuit, increases the 'strength' of the write port, improving writeability. The access transistors for the write port can be made large so as to easily over-write the single bit value stored in the storage sub-circuit. Because the write port is separate from the read port, increasing the drive strength of the access transistors for the write port does not increase the occurrence of read disturb faults.

To improve resistance to read disturb faults, the read access transistors 260 and 265 are sized to have a weaker drive strength compared with the pull-up transistors 270 and 275 in the storage sub-circuit. Prior to a read operation, the differential read bit lines, bit line read H 216 and bit line read L 220, are precharged to a low voltage, such as ground or the low power supply. After the differential read bit lines are precharged, the two read access transistors 260 and 265 are enabled by negating the word line read 214, i.e., driving the word line read 214 to the low voltage. While the two read access transistors are enabled, the voltage level of one of the read bit lines rises above the precharge voltage. The read operation is completed by sensing the voltage difference between the bit line read H 210 and the bit line read L 220. A differential voltage that is developed between the bit line read H 210 and the bit line read L 220 represents the single bit value stored in the storage sub-circuit.

The voltage difference should be at least 100 millivolts (mV) to be sampled. In contrast, the conventional 8-transistor storage cell 110 read port typically requires that the voltage on the read bit-line fall by at least half of the power supply voltage in order to be sensed. As previously explained, because the voltage swings on the differential read bit lines H 210 and L 220 are smaller compared with the voltage swing on the bit line read 120 power consumption is reduced for the 8-transistor storage cell with differential read 200. Another advantage of the smaller voltage swings is that the sensing of the differential voltage representing the single bit value is faster compared with the single-ended read signal in the conventional 8-transistor storage cell 110.

In terms of layout efficiency of the transistors comprising the 8-transistor storage cell with differential read 200, in one embodiment the NMOS transistors 250 and 255 may be sized to have the same width (and consequently the same drive strength) as the pull-down transistors 280 and 285. When the NMOS transistors are sized in this manner, the transistor drive strengths are matched, the transistors are aligned in terms of layout, and the thin oxide layer is not notched to accommodate a difference in transistors widths. Therefore, the layout is more efficient, resulting in a denser circuit for fabrication.

To ensure writability of the storage sub-circuit, the write access transistors 250 and 255 may be sized to have a greater drive strength than the pull-up transistors 270 and 275 in the storage sub-circuit. Overall, to ensure that read and write operations function properly for the 8-transistor storage cell with differential read 200, the drive strength of the write access transistors should be greater than the drive strength of the pull-up transistors, which should have a greater drive strength compared with the read access transistors.

Figure 2B:
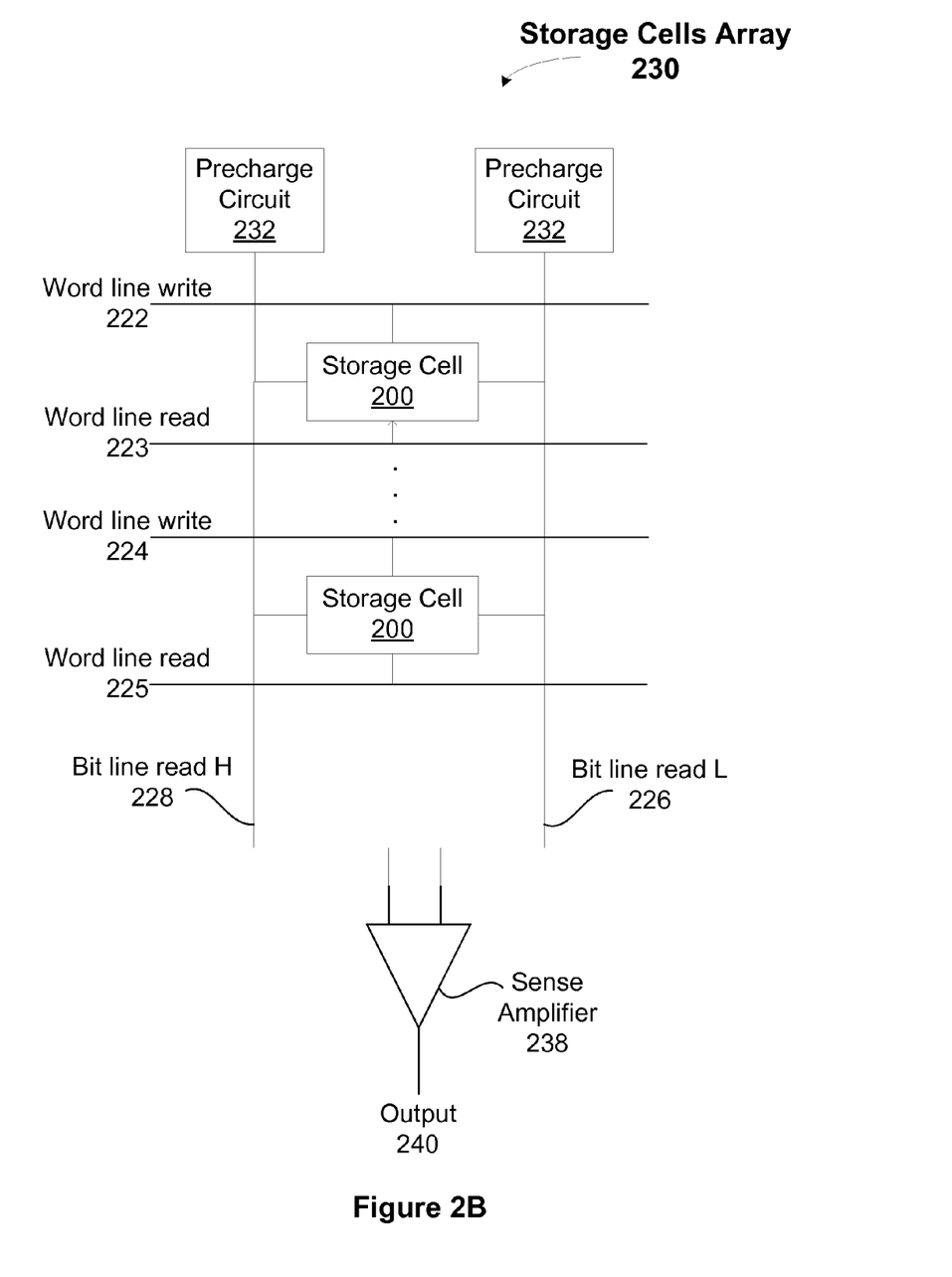
FIG. 2B illustrates another diagram of multiple 8-transistor storage cells in a memory array, according to one embodiment of the invention.

FIG. 2B illustrates a diagram of multiple 8-transistor storage cells with differential read 200 in a storage cells array 230, according to one embodiment of the invention. The memory array shown in FIG. 2B uses differential or complementary bit lines, bit line read H 228 and bit line read L 226. The precharge circuits 232 precharge the complementary bit lines to a low voltage level, such as the low power supply (VSS or ground) prior to a read operation. When a read operation is performed, i.e., the word line read 223 or 225 is enabled, the current flowing through each of the bit lines, bit line read H 228 and bit line read L 226, is converted into amplified voltages by the sense amplifier 238. The sense amplifier 238 samples the bit line read H 228 and bit line read L 226 to generate the output 240. The sense amplifier 238 can be gated off when not in use to save power. When a write operation is performed, i.e., the word line write 224 or 222 is enabled, and the current flowing through each of the word bit lines H and L (not shown) is transferred to the storage cell 200 associated with the enabled word line write.

Figure 3:
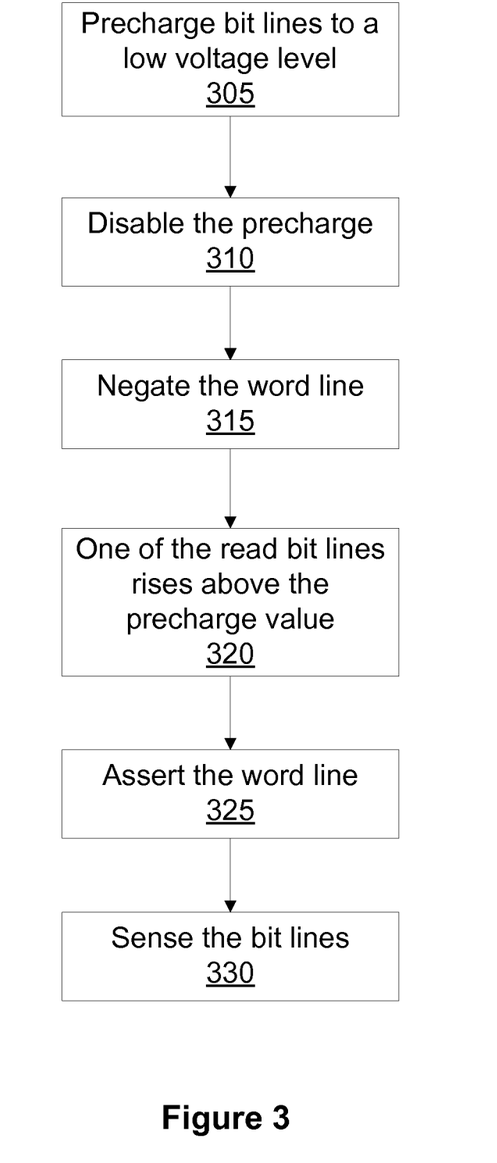
FIG. 3 illustrates a method of performing a read operation using the 8-transistor storage cell, according to one embodiment of the invention.

FIG. 3 illustrates a method of performing a read operation using the 8-transistor storage cell 200, in accordance with one or more aspects of the present invention. Although the method steps are described in conjunction with the systems of FIGS. 2A and 2B, persons skilled in the art will understand that any system configured to perform the method steps, in any order, is within the scope of the invention.

At step 305, a first read bit line and a second read bit line, e.g., bit line read H 210 and bit line read L 220, are precharged to a low power supply voltage, e.g., VSS or ground, prior to a read operation. At step 310, the precharge is disabled and the precharged bit lines remain precharged at substantially the low power supply voltage. At step 315, at least one read word line (word line read 214) is negated to perform a read operation. Specifically, a read word line is configured to enable a differential representation of a single bit value stored in a storage sub-circuit within the 8-transistor storage cell with differential read 200 to be transferred to the first read bit line and the second read bit line.

At step 320, one of the bits lines, either bit line read H 210 or bit line read L 220 rises above the precharge voltage level. At step 325 the read word line that was negated at step 315 is asserted. At step 330, the differential representation of the single bit value is sampled by the sense amplifier 238 at the first read bit line and the second read bit line to complete the read operation. In other embodiments, a sense amplifier 238 is not used and the read bit lines are sensed directly.

Power consumption is reduced for the 8-transistor storage cell with differential read 200 because the voltage swings on the differential read bit lines, bit line read H 210 and bit line read L 220 are reduced. Sensing of the differential voltage representing the single bit value may also be faster compared with the single-ended read signal in the conventional 8-transistor storage cell 110.

System Overview

Figure 4:
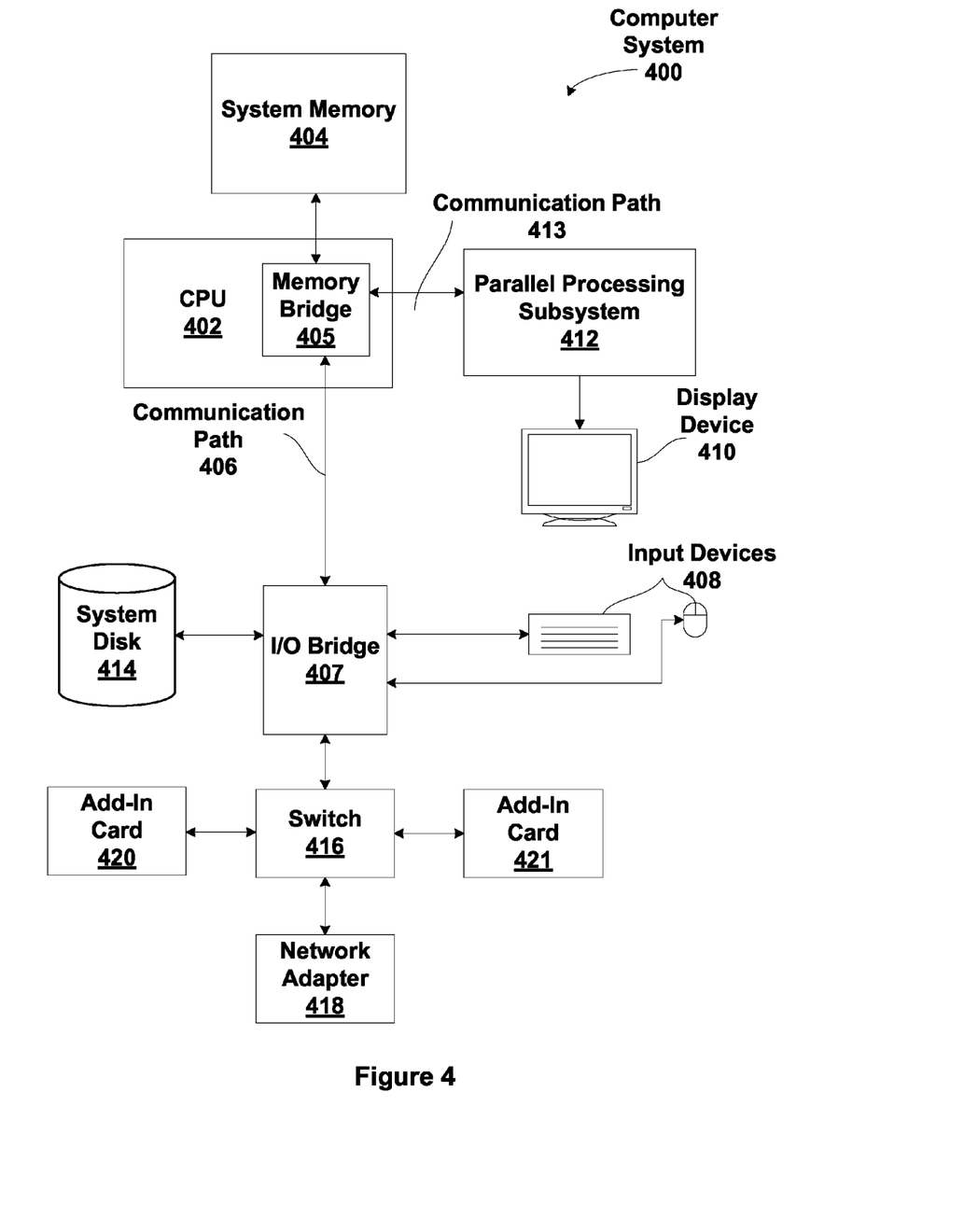
FIG. 4 is a block diagram illustrating a computer system configured to implement one or more aspects of the present invention.

FIG. 4 is a block diagram illustrating a computer system 100 configured to implement one or more aspects of the present invention. Computer system 400 includes a central processing unit (CPU) 402 and a system memory 404 communicating via a bus path through a memory bridge 405. Memory bridge 405 may be integrated into CPU 402 as shown in FIG. 4. Alternatively, memory bridge 405, may be a conventional device, e.g., a Northbridge chip, that is connected via a bus to CPU 402. Memory bridge 405 is connected via communication path 406 (e.g., a HyperTransport link) to an I/O (input/output) bridge 407. I/O bridge 407, which may be, e.g., a Southbridge chip, receives user input from one or more user input devices 408 (e.g., keyboard, mouse) and forwards the input to CPU 402 via path 406 and memory bridge 405.

A parallel processing subsystem 412 is coupled to memory bridge 405 via a bus or other communication path 413 (e.g., a PCI Express, Accelerated Graphics Port, or HyperTransport link); in one embodiment parallel processing subsystem 412 is a graphics subsystem that delivers pixels to a display device 410 (e.g., a conventional CRT or LCD based monitor). A system disk 414 is also connected to I/O bridge 407. A switch 416 provides connections between I/O bridge 407 and other components such as a network adapter 418 and various add-in cards 420 and 421. Other components (not explicitly shown), including USB or other port connections, CD drives, DVD drives, film recording devices, and the like, may also be connected to I/O bridge 407. Communication paths interconnecting the various components in FIG. 4 may be implemented using any suitable protocols, such as PCI (Peripheral Component Interconnect), PCI-Express (PCI-E), AGP (Accelerated Graphics Port), HyperTransport, or any other bus or point-to-point communication protocol(s), and connections between different devices may use different protocols as is known in the art.

In one embodiment, the parallel processing subsystem 412 incorporates circuitry optimized for graphics and video processing, including, for example, video output circuitry, and constitutes a graphics processing unit (GPU). In another embodiment, the parallel processing subsystem 412 incorporates circuitry optimized for general purpose processing, while preserving the underlying computational architecture, described in greater detail herein. In yet another embodiment, the parallel processing subsystem 412 may be integrated with one or more other system elements, such as the memory bridge 405, CPU 402, and I/O bridge 407 to from a system on chip (SoC). One or more of CPU 402, parallel processing sub-system 412, system memory 404, I/O bridge 407, and switch 416 may include an 8-transistor storage cell with differential read 200 and/or storage cells array 230.

It will be appreciated that the system shown herein is illustrative and that variations and modifications are possible. The connection topology, including the number and arrangement of bridges, may be modified as desired. For instance, in some embodiments, system memory 404 is connected to CPU 402 directly rather than through a bridge, and other devices communicate with system memory 404 via memory bridge 405 and CPU 402. In other alternative topologies, parallel processing subsystem 412 is connected to I/O bridge 407 or directly to CPU 402, rather than to memory bridge 405. In still other embodiments, one or more of CPU 402, I/O bridge 407, parallel processing subsystem 412, and memory bridge 405 may be integrated into one or more chips. The particular components shown herein are optional; for instance, any number of add-in cards or peripheral devices might be supported. In some embodiments, switch 416 is eliminated, and network adapter 418 and add-in cards 420, 421 connect directly to I/O bridge 407.

In sum, the disclosed 8-transistor storage cell performs read operations by detecting a voltage difference developed on differential read bit lines. The differential read bit lines are precharged to a low voltage level prior to each read operation. Compared with conventional storage cells having a single-ended read bit line, the difference between the "1" and "0" stored value is detected for relatively low voltage swings. In addition, the read port is separated from the write port, enabling the access transistors used for write operations to be sized independently from the access transistors used for read operations.

Advantageously, dynamic power dissipation of the 8-transistor storage cell is reduced compared with memory arrays using conventional storage cells that need to be precharged to a high voltage level prior to each read operation. Dynamic power dissipation is also reduced because read operations are performed using relatively low voltage swings. Additionally, the 8-transistor storage cell reduces read faults compared with 6-transistor storage cells, because the access transistors used for read operations may be sized independently from the access transistors used for write operations. Therefore, read operations are robust, even though the characteristics of transistors may vary due to the fabrication process and transistor sizes are being reduced as the fabrication process shrinks.

One embodiment of the invention may be implemented as a program product for use with a computer system. The program(s) of the program product define functions of the embodiments (including the methods described herein) and can be contained on a variety of computer-readable storage media. Illustrative computer-readable storage media include, but are not limited to: (i) non-writable storage media (e.g., read-only memory devices within a computer such as CD-ROM disks readable by a CD-ROM drive, flash memory, ROM chips or any type of solid-state non-volatile semiconductor memory) on which information is permanently stored; and (ii) writable storage media (e.g., floppy disks within a diskette drive or hard-disk drive or any type of solid-state random-access semiconductor memory) on which alterable information is stored.

The invention has been described above with reference to specific embodiments. Persons skilled in the art, however, will understand that various modifications and changes may be made thereto without departing from the broader spirit and scope of the invention as set forth in the appended claims. The foregoing description and drawings are, accordingly, to be regarded in an illustrative rather than a restrictive sense.

Therefore, the scope of embodiments of the present invention is set forth in the claims that follow.

The invention claimed is:

1. A transistor storage cell circuit, comprising:
a read port that performs read operations and includes a first access transistor and a second access transistor;
a first read bit line that is precharged to a low power supply voltage prior to a read operation and is coupled to the read port;
a second read bit line that is precharged to the low power supply voltage prior to the read operation and is coupled to the read port, wherein the low power supply voltage comprises a ground voltage;
a storage sub-circuit that is coupled to the first read bit line through the first access transistor and is coupled to the second read bit line through the second access transistor, wherein the storage sub-circuit includes a first pull-up transistor and a second pull-up transistor and is configured to store a single bit value;
a read word line that is coupled to the read port via a gate of the first access transistor and via a gate of the second access transistor and configured to enable a differential representation of the single bit value to be transferred to the first read bit line and the single bit value to be transferred to the second read bit line during the read operation; and
a write port that performs write operations and is separate and independent from the read port, the write port including a third access transistor and a fourth access transistor,
wherein a drive strength of the third access transistor and the fourth access transistor is greater than a drive strength of the first pull-up transistor and the second pull-up transistor, and the drive strength of the first pull-up transistor and the second pull-up transistor is greater than a drive strength of the first access transistor and the second access transistor,
wherein the drive strength of the third access transistor and the fourth access transistor and the drive strength of the first access transistor and the second access transistor are independently adjustable, and
wherein increasing the drive strength of the third access transistor and the fourth access transistor does not increase the occurrence of read disturb faults associated with read operations performed via the read port.

2. The transistor storage cell circuit of claim 1, further comprising:
a first write bit line that is coupled to the storage sub-circuit through the third access transistor; and
a second write bit line that is coupled to the storage sub-circuit through the fourth access transistor.

3. The transistor storage cell circuit of claim 2, further comprising a write word line that is coupled to a gate of the third access transistor and a gate of the fourth access transistor and configured to enable the differential representation of the single bit value to be transferred from the first write bit line and the second write bit line to be transferred to the storage sub-circuit during a write operation.

4. The transistor storage cell circuit of claim 1, wherein the read word line is negated during the read operation.

5. The transistor storage cell circuit of claim 1, wherein the differential representation of the single bit value is at least 100 millivolts and less than half of a difference between a high power supply voltage and the low power supply voltage.

6. The transistor storage cell circuit of claim 1, wherein the first read port and the first write port are physically separate from one another.

7. The transistor storage cell circuit of claim 2, further comprising:
a set of pull-down transistors configured as cross-coupled inverters,
wherein at least two pull-down transistors in the set of pull-down transistors have widths equal to widths associated with the third access transistor and the fourth access transistor.

8. The transistor storage cell circuit of claim 7, wherein the at least two pull-down transistors, the third access transistor, and the fourth access transistor are not notched to accommodate a difference in transistor widths and are substantially aligned within the storage cell circuit.

9. A memory array, comprising:
a plurality of transistor storage cell circuits, wherein each transistor storage cell circuit, comprises:
a read port that performs read operations and includes a first access transistor and a second access transistor;
a first read bit line that is precharged to a low power supply voltage prior to a read operation and is coupled to the read port;
a second read bit line that is precharged to the low power supply voltage prior to the read operation and is coupled to the read port, wherein the low power supply voltage comprises a ground voltage;
a storage sub-circuit that is coupled to the first read bit line through the first access transistor and is coupled to the second read bit line through the second access transistor, wherein the storage sub-circuit includes a first pull-up transistor and a second pull-up transistor and is configured to store a single bit value;
a read word line that is coupled to the read port via a gate of the first access transistor and via a gate of the second access transistor and configured to enable a differential representation of the single bit value to be transferred to the first read bit line and the single bit value to be transferred to the second read bit line during the read operation; and
a write port that performs write operations and is separate and independent from the read port, the write port including a third access transistor and a fourth access transistor,
wherein a drive strength of the third access transistor and the fourth access transistor is greater than a drive strength of the first pull-up transistor and the second pull-up transistor, and the drive strength of the first pull-up transistor and the second pull-up transistor is greater than a drive strength of the first access transistor and the second access transistor,
wherein the drive strength of the third access transistor and the fourth access transistor and the drive strength of the first access transistor and the second access transistor are independently adjustable, and
wherein increasing the drive strength of the third access transistor and the fourth access transistor does not increase the occurrence of read disturb faults associated with read operations performed via the read port.

10. The memory array of claim 9, wherein each transistor storage cell circuit, further comprises:
a first write bit line that is coupled to the storage sub-circuit through the third access transistor; and
a second write bit line that is coupled to the storage sub-circuit through the fourth access transistor.

11. The memory array of claim 9, wherein the read word line is negated during the read operation.

12. The memory array of claim 9, wherein the differential representation of the single bit value is at least 100 millivolts and less than half of a difference between a high power supply voltage and the low power supply voltage.

13. A method of reading differential read bit lines of an eight transistor storage cell circuit, comprising:
precharging a first read bit line and a second read bit line coupled to a read port to a low power supply voltage prior to a read operation, wherein the low power supply voltage comprises a ground voltage;
configuring a read word line coupled to the first read port to enable a differential representation of a single bit value stored in a storage sub-circuit to be transferred to the first read bit line and the second read bit line from the first read port, wherein the storage sub-circuit includes a first pull-up transistor and a second pull-up transistor; and
sampling the differential representation of the single bit value at the first read bit line and the second read bit line to complete the read operation,
wherein the read port performs read operations and includes a first access transistor that couples the first read bit line to the storage sub-circuit and a second access transistor that couples the second read bit line to the storage sub-circuit,
wherein a write port performs write operations and is separate and independent from the read port, the write port including a third access transistor and a fourth access transistor,
wherein a drive strength of the third access transistor and the fourth access transistor is greater than a drive strength of the first pull-up transistor and the second pull-up transistor, and the drive strength of the first pull-up transistor and the second pull-up transistor is greater than a drive strength of the first access transistor and the second access transistor,
wherein the drive strength of the third access transistor and the fourth access transistor and the drive strength of the first access transistor and the second access transistor are independently adjustable, and
wherein increasing the drive strength of the third access transistor and the fourth access transistor does not increase the occurrence of read disturb faults associated with read operations performed via the read port.

14. The method of claim 13, wherein the differential representation of the single bit value is transferred to the storage sub-circuit from a first write bit line and a second write bit line.

15. The method of claim 13, wherein the read word line is negated during the read operation.

* * * * *

UNITED STATES PATENT AND TRADEMARK OFFICE
CERTIFICATE OF CORRECTION

PATENT NO.        : 9,627,021 B2
APPLICATION NO.   : 13/648053
DATED             : April 18, 2017
INVENTOR(S)       : John W. Poulton and Brian Zimmer It is certified that error appears in the above-identified patent and that said Letters Patent is hereby corrected as shown below:

In the Claims

Column 10, Claim 13, Line 19, delete "first".

Signed and Sealed this
Twelfth Day of September, 2017

Joseph Matal
*Performing the Functions and Duties of the*
*Under Secretary of Commerce for Intellectual Property and*
*Director of the United States Patent and Trademark Office*